（12）United States Patent
Hsu

(10) Patent No.: US 12,144,137 B2
(45) Date of Patent: Nov. 12, 2024

(54) TOOL-FREE UNLOCKING MECHANISM

(71) Applicant: Nan Juen International Co., Ltd., Taoyuan (TW)

(72) Inventor: Mao-Ching Hsu, Taoyuan (TW)

(73) Assignee: Nan Juen International Co., Ltd., Taoyuan (TW)

( * ) Notice: Subject to any disclaimer, the term of this patent is extended or adjusted under 35 U.S.C. 154(b) by 187 days.

(21) Appl. No.: 17/965,683

(22) Filed: Oct. 13, 2022

(65) Prior Publication Data

US 2023/0209758 A1 Jun. 29, 2023

(30) Foreign Application Priority Data

Dec. 24, 2021 (TW) ................................. 110215512

(51) Int. Cl.
*H05K 7/14* (2006.01)
*A47B 88/57* (2017.01)

(52) U.S. Cl.
CPC ........... *H05K 7/1401* (2013.01); *A47B 88/57* (2017.01); *H05K 7/1489* (2013.01)

(58) Field of Classification Search
CPC ..... H05K 7/1401; H05K 7/1489; A47B 88/57
See application file for complete search history.

(56) References Cited

U.S. PATENT DOCUMENTS

| | | | | |
|---|---|---|---|---|
| 6,373,707 B1* | 4/2002 | Hutchins | ................. | G06F 1/183 |
| | | | | 211/41.17 |
| 7,604,308 B2* | 10/2009 | Tseng | ................... | A47B 88/423 |
| | | | | 312/334.46 |
| 7,611,213 B2* | 11/2009 | Wu | ....................... | A47B 88/493 |
| | | | | 292/87 |
| 8,282,176 B1* | 10/2012 | Chen | ..................... | A47B 88/493 |
| | | | | 312/334.46 |
| 8,540,328 B2* | 9/2013 | Chen | ...................... | A47B 88/57 |
| | | | | 312/333 |
| 9,279,451 B2* | 3/2016 | Judge | ...................... | F16C 29/04 |
| 9,313,914 B2* | 4/2016 | Judge | ................... | A47B 88/443 |
| 9,382,943 B2* | 7/2016 | Judge | .................... | F16C 29/048 |
| 9,670,956 B2* | 6/2017 | Judge | ...................... | F16C 29/04 |
| 2004/0056572 A1* | 3/2004 | Chen | .................... | A47B 88/473 |
| | | | | 312/333 |

* cited by examiner

*Primary Examiner* — Ko H Chan

(57) ABSTRACT

The present invention relates to a tool-free unlocking mechanism including a connecting member and a mounting member, wherein the connecting member has at least one mounting hole that can be placed on the mounting member, and the tool-free unlocking mechanism can be quickly positioned on a bracket.

19 Claims, 14 Drawing Sheets

TOOL-FREE UNLOCKING MECHANISM

BACKGROUND OF THE INVENTION

1. Field of the Invention

The present invention relates to an unlocking mechanism, especially a tool-free unlocking mechanism applied to a server slide rail.

2. Description of the Related Art

The server slide rail is installed between the server chassis and the cabinet, and a buckle member at the front of the server slide rail is positioned in the column hole of the cabinet to prevent the server chassis from sliding out of the cabinet. The buckle member needs to be fixed on the slide rail by screws and nuts. However, when loading and dismounting the fixing method on the slide rail, tools must be used to operate, and the procedure is time-consuming.

SUMMARY OF THE INVENTION

The present invention has been accomplished under the circumstances in view. It is therefore the main object of the present invention to provide a tool-free unlocking mechanism to be applied to a server slide rail. The tool-free unlocking mechanism comprises a connecting member and a mounting member. The mounting member comprises at least one elastic element and an actuating element. The actuating element comprises a snap feature, and the actuating element is supported by the elastic force of the at least one elastic element. The connecting member is being used to connect the mounting member and a first slide rail. The connecting member comprises a positioning portion, a bending portion and a mounting portion. The positioning portion is to be arranged and fixed on the first slide rail. The mounting portion is being provided with at least one mounting hole to be arranged to fix the mounting member. The tool-free unlocking mechanism is fixed on the first slide rail, the first slide rail movable relative to a second slide rail, and a bracket is fixed on the second slide rail, so that the tool-free unlocking mechanism is displaced to a predetermined position to be mutually snapped with a first buckle member of the bracket to be fixed in a positioning state, and applying force to the actuating member separates the tool-free unlocking mechanism from the bracket to an unlocking state.

DETAILED DESCRIPTION OF THE PREFERRED EMBODIMENT

Figure 1:
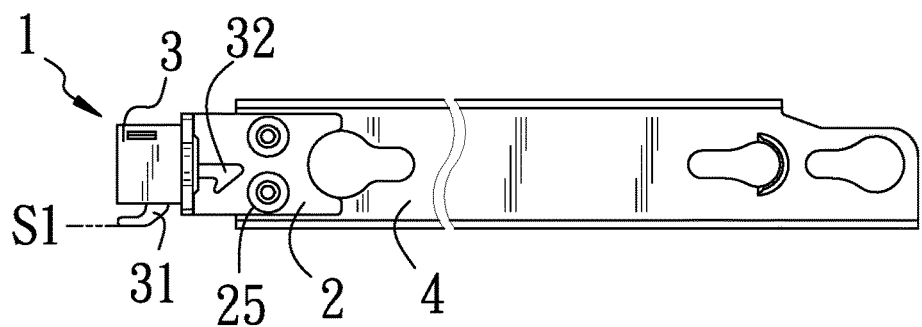
FIG. 1 is a schematic view of the action status I of the tool-free unlocking mechanism of the first embodiment of present invention on the first slide rail.

Referring to FIGS. 1-3d, the tool-free unlocking mechanism 1 of the present invention comprises a connecting member 2 and a mounting member 3. The connecting member 2 comprises a mounting portion 21, a positioning portion 22 and a bending portion 24. The mounting portion 21 is provided with at least one mounting hole 26 which can be arranged to fix the mounting member 3. The bending portion 24 is connected to the mounting portion 21 and the positioning portion 22. The positioning portion 22 comprises a bottom surface 23 and at least one positioning hole 25. The connecting member 2 is used to connect the mounting member 3. The mounting member 3 comprises at least one elastic element 33 and an actuating element 31. The mounting member 3 has a snap feature 32 which is the bent end of the actuating element 31

Preferably, the connecting member 2 is being L-shaped by stamping.

Figure 3A:
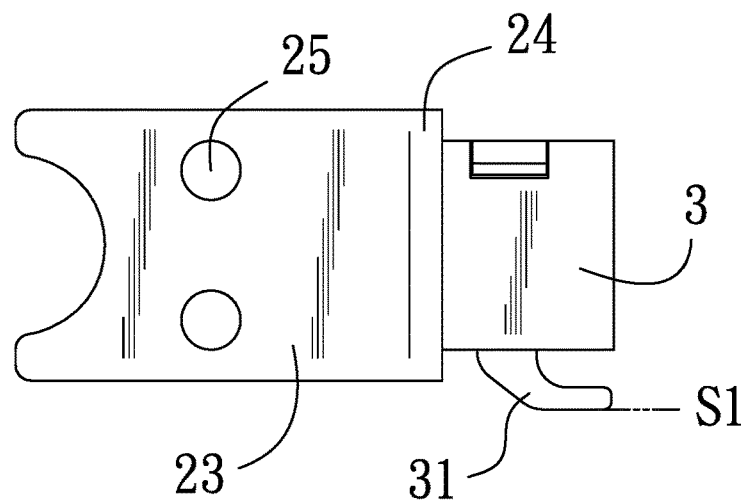
FIG. 3a is a schematic front view of the tool-free unlocking mechanism of the first embodiment of the present invention.
Figure 3B:
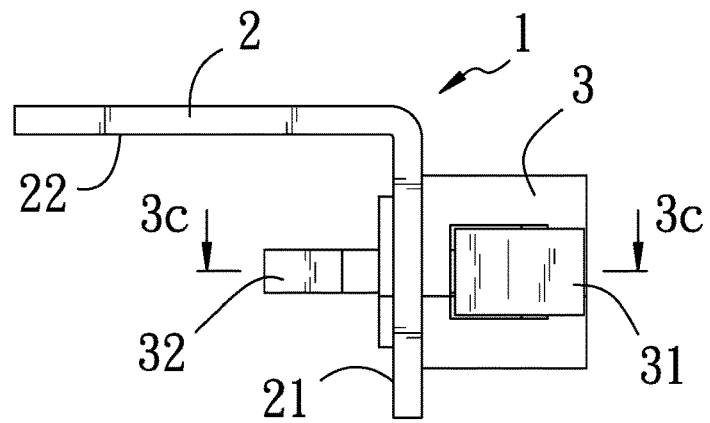
FIG. 3b is a schematic side view of the tool-free unlocking mechanism of the first embodiment of the present invention.
Figure 3C:
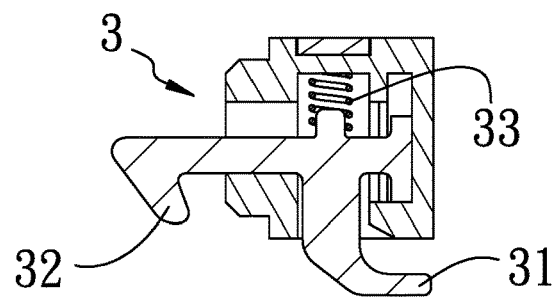
FIG. 3c is a cross-sectional view of the mounting device of the tool-free unlocking mechanism of the first embodiment of the present invention.

As shown in FIGS. 1 and 3c, the tool-free unlocking mechanism 1 is arranged to be fixed on a first slide rail 4. The actuating element 31 is maintained in balance by the elastic force of the elastic element 33, so that the tool-free unlocking mechanism 1 is in a positioning state S1.

Figure 2:
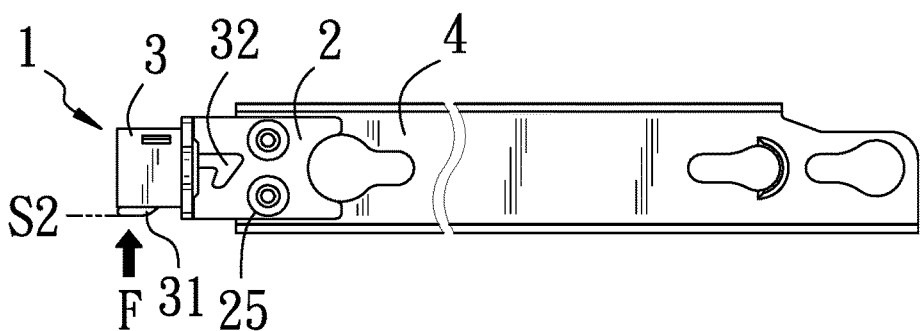
FIG. 2 is a schematic view of the action status II of the tool-free unlocking mechanism of the first embodiment of the invention on the first slide rail.

As shown in FIG. 2, applying an external force F to the actuating element 31 can change the original state, so that the tool-free unlocking mechanism 1 changes from the positioning state S1 to an unlocking state S2. The positioning hole 25 can be quickly arranged to be fastened to the first slide rail 4.

As shown in FIGS. 3a-3c, the elastic element 33 is used to maintain the actuating element 31 in the positioning state S1. The elastic element 33 and the actuating element 31 form a latching structure. The elastic element 33 is a spring.

Figure 3D:
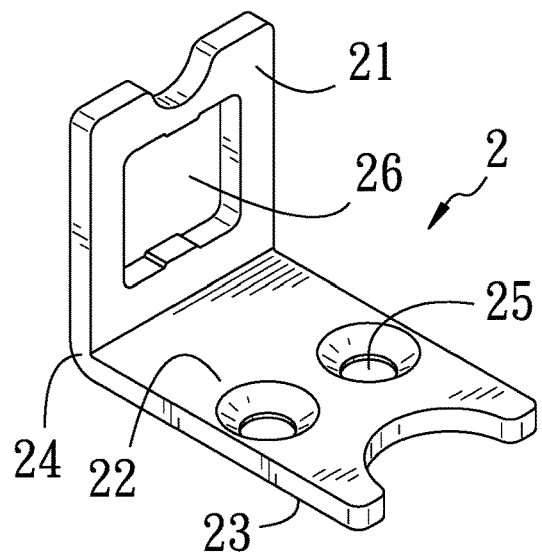
FIG. 3d is a three-dimensional view of the connecting member of the tool-free unlocking mechanism of the first embodiment of the present invention.

As shown in FIG. 3d, the positioning hole 25 is round. The mounting portion 21 is provided with at least one mounting hole 26, the mounting hole 26 can be arranged to fix the mounting member 3.

Figure 4A:
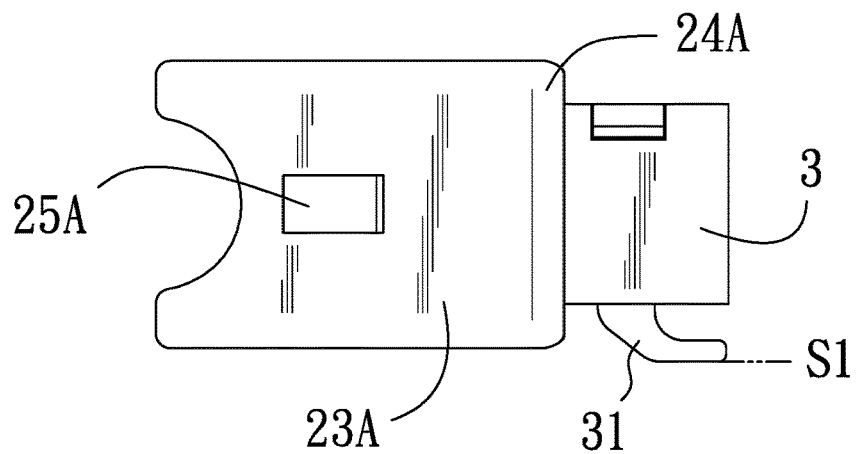
FIG. 4a is a schematic front view of the tool-free unlocking mechanism of the second embodiment of the present invention.
Figure 4B:
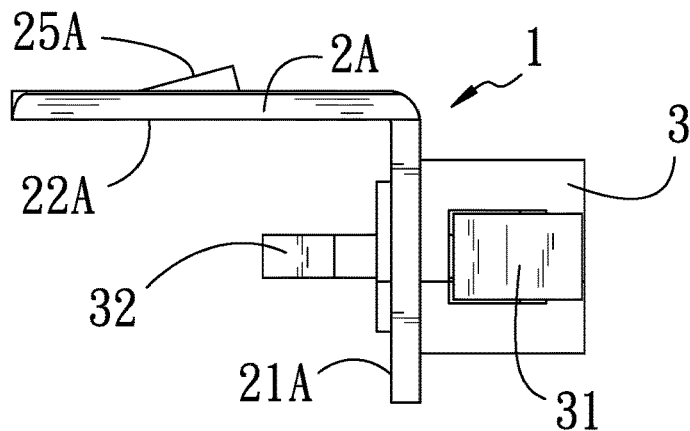
FIG. 4b is a schematic side view of the tool-free unlocking mechanism of the second embodiment of the present invention.
Figure 4C:
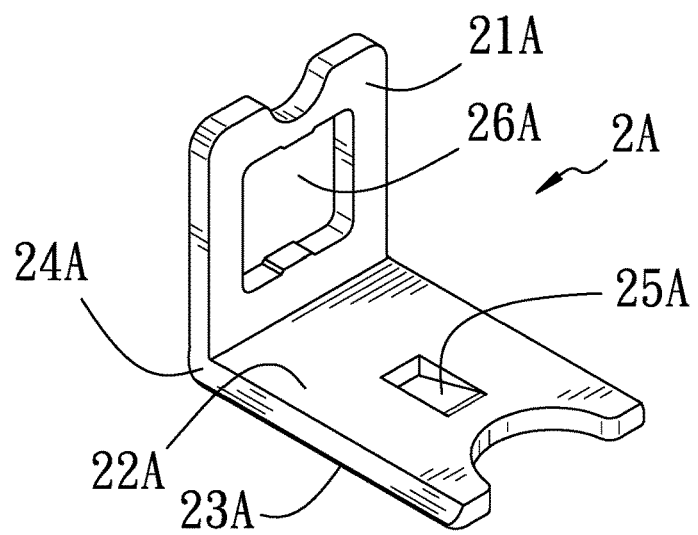
FIG. 4c is a three-dimensional view of the connecting member of the tool-free unlocking mechanism of the second embodiment of the present invention.

As shown in FIGS. 4a-4c, in this embodiment, the tool-free unlocking mechanism 1 is composed of a connecting member 2A and a mounting member 3. The connecting member 2A comprises a mounting portion 21A, a positioning portion 22A and a bending portion 24A. The positioning portion 22A comprises a bottom surface 23A and at least one connecting feature 25A. The connecting feature 25A which is a convex of the positioning portion 22A. The mounting portion 21A is provided with at least one mounting hole 26A.

Figure 4D:
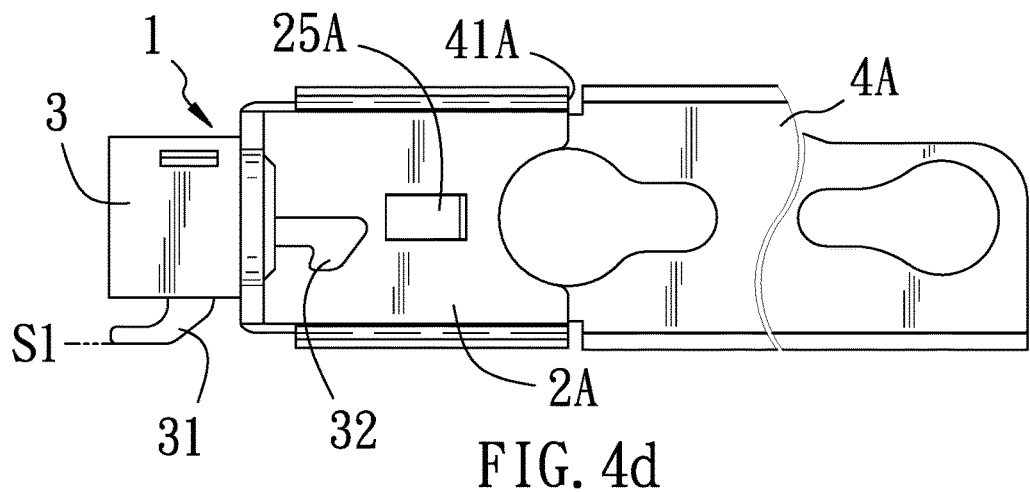
FIG. 4d is a schematic top view of the second embodiment of the invention being installed on the first slide rail.

As shown in FIG. 4d, the tool-free unlocking mechanism 1 is arranged to be fixed on a first slide rail 4A, wherein the width of the positioning portion 22A of the connecting member 2A is smaller than that of the frame groove 41A of the first slide rail 4A. The positioning portion 22A can be slid into the frame groove 41A and arranged to be fixed. The tool-free unlocking mechanism 1 is arranged and fixed on the first slide rail 4A, and the tool-free unlocking mechanism 1 is in the positioning state S1.

Figure 5A:
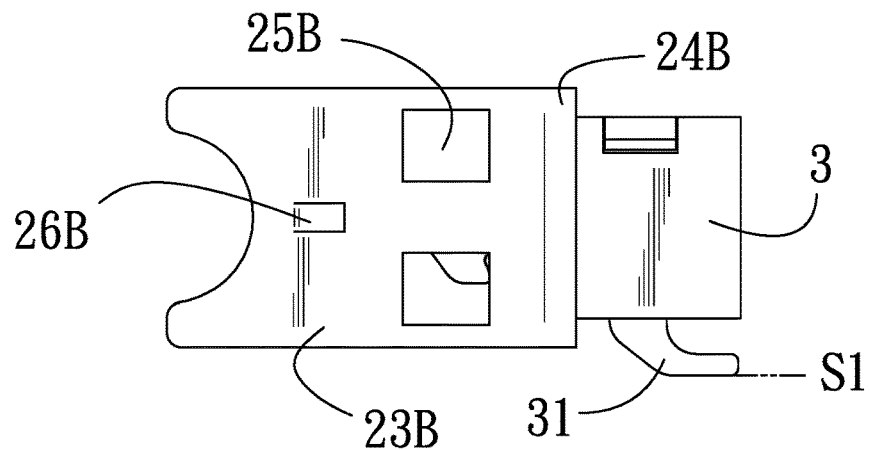
FIG. 5a is a schematic front view of the tool-free unlocking mechanism of the third embodiment of the present invention.
Figure 5B:
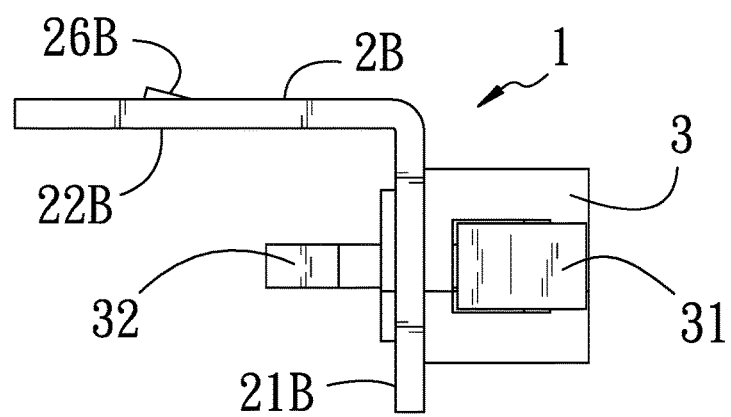
FIG. 5b is a schematic side view of the tool-free unlocking mechanism of the third embodiment of the present invention.
Figure 5C:
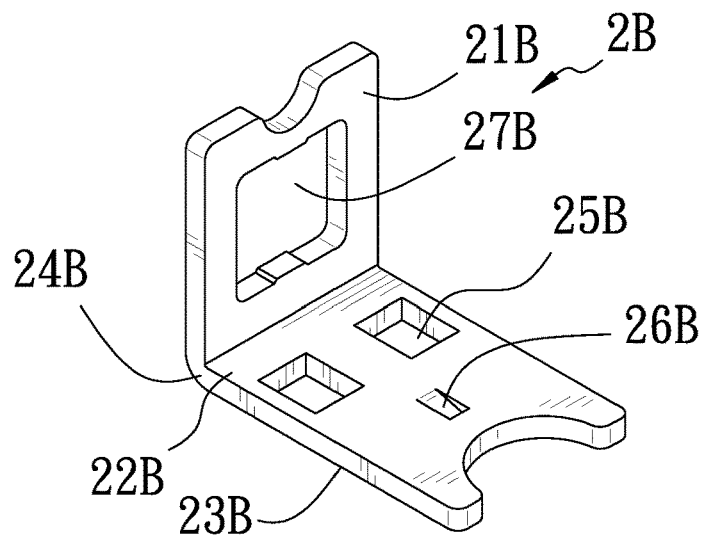
FIG. 5c is a three-dimensional view of the connecting member of the tool-free unlocking mechanism of the third embodiment of the present invention.

As shown in FIGS. 5a-5c, in this embodiment, the tool-free unlocking mechanism 1 is composed of a connecting member 2B and a mounting member 3. The connecting member 2B comprises a mounting portion 21B, a positioning portion 22B and a bending portion 24B, wherein the positioning portion 22B comprises a bottom surface 23B, at least one positioning hole 25B and a connecting feature 26B, the connecting feature 26B form a convex which can be quickly arranged and fixed on a first slide rail 4B. The mounting portion 21B is provided with at least one mounting hole 27B.

Figure 5D:
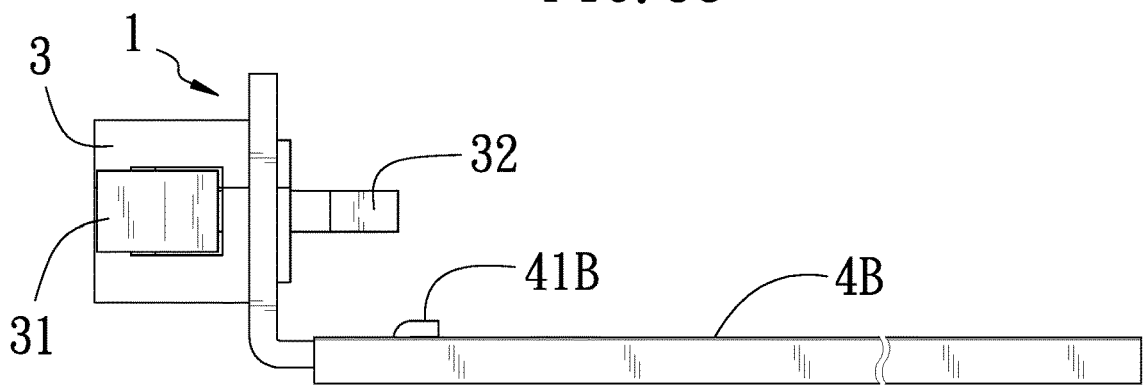
FIG. 5d is a schematic side view of the third embodiment of the invention being installed on the first slide rail.
Figure 5E:
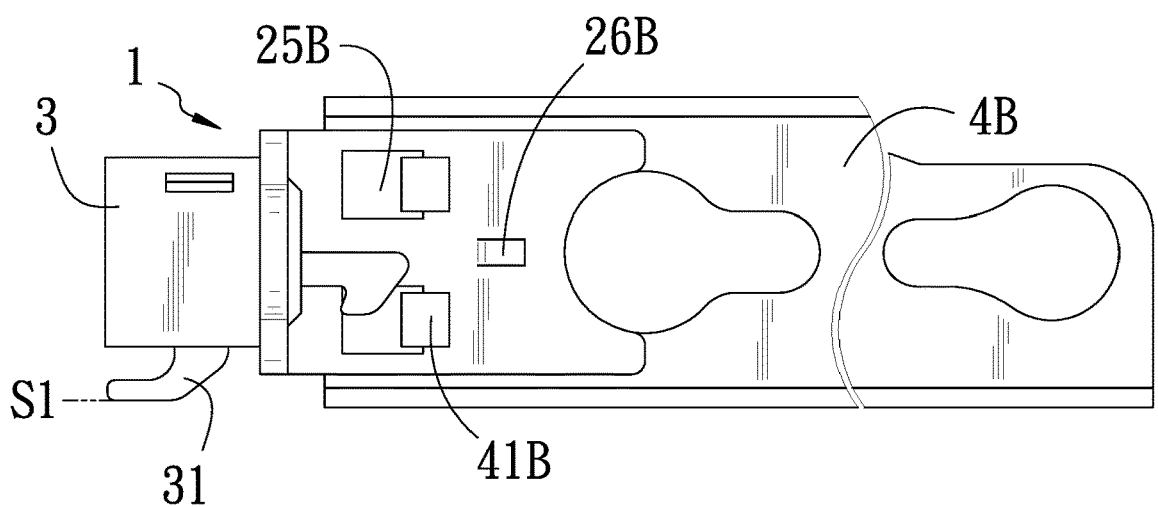
FIG. 5e is a schematic top view of the third embodiment of the invention being installed on the first slide rail.

As shown in FIGS. 5d-5e, the positioning portion 22B of the connecting member 2B of the tool-free unlocking mechanism 1 comprises the positioning hole 25B which can be arranged and fixed with the at least one latching portion 41B of the first slide rail 4B, and the positioning hole is rectangular. As shown in FIG. 5d, the tool-free unlocking mechanism 1 is arranged and fixed on the first slide rail 4B, and the tool-free unlocking mechanism 1 is in the positioning state S1.

Figure 6A:
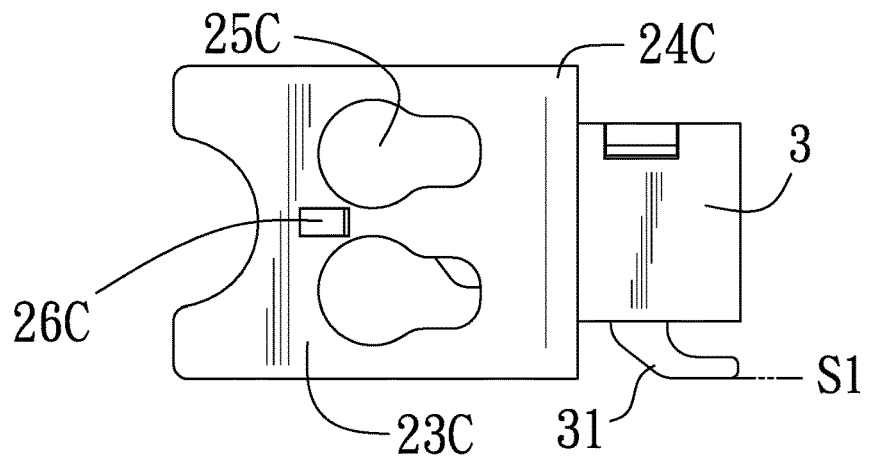
FIG. 6a is a schematic front view of the tool-free unlocking mechanism of the fourth embodiment of the present invention.
Figure 6B:
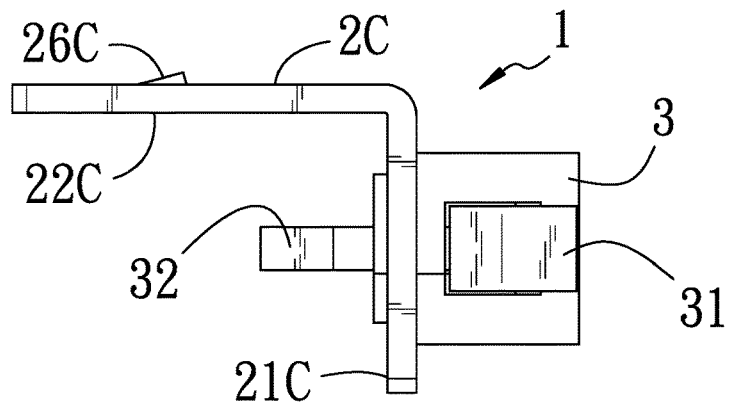
FIG. 6b is a schematic side view of the tool-free unlocking mechanism of the fourth embodiment of the present invention.
Figure 6C:
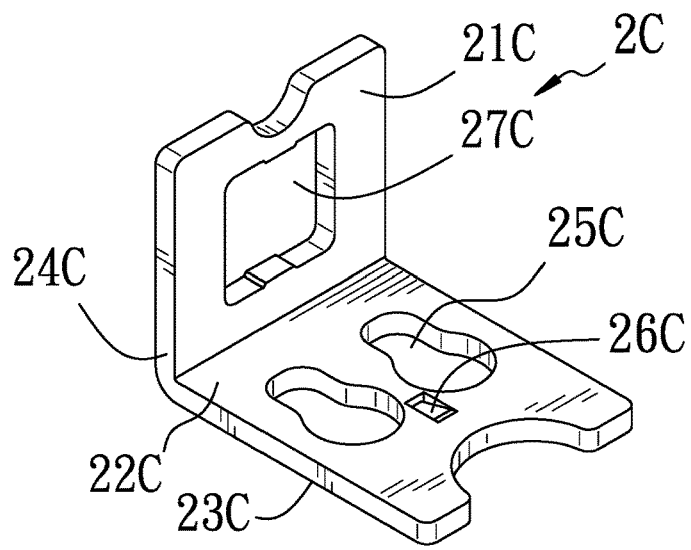
FIG. 6c is a three-dimensional view of the connecting member of the tool-free unlocking mechanism of the fourth embodiment of the present invention.

As shown in FIGS. 6a-6c, in this embodiment, the tool-free unlocking mechanism 1 is composed of a connecting member 2C and a mounting member 3. The connecting member 2C comprises a mounting portion 21C, a positioning portion 22C and a bending portion 24C, wherein the positioning portion 22C comprises a bottom surface 23C, at least one positioning hole 25C and a connecting feature 26C, the connecting feature 26C form a convex which can be quickly arranged and fixed on a first slide rail 4C. The mounting portion 21C is provided with at least one mounting hole 27C.

Figure 6D:
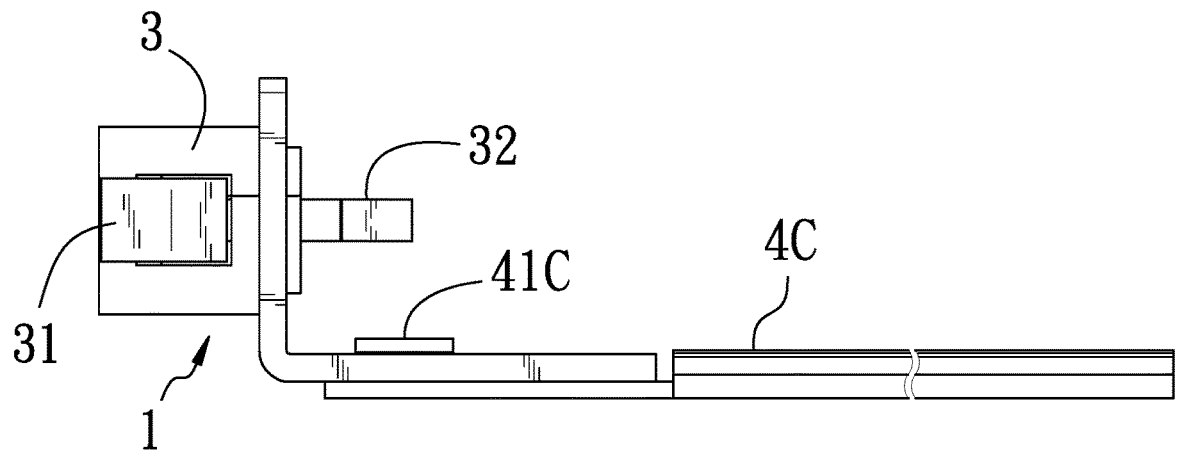
FIG. 6d is a schematic side view of the fourth embodiment of the invention being installed on the first slide rail.

As shown in FIG. 6d, the positioning portion 22C of the connecting member 2C of the tool-free unlocking mechanism 1 comprises the positioning hole 25C which can be arranged and fixed with the at least one latching portion 41C of the first slide rail 4C.

Figure 6E:
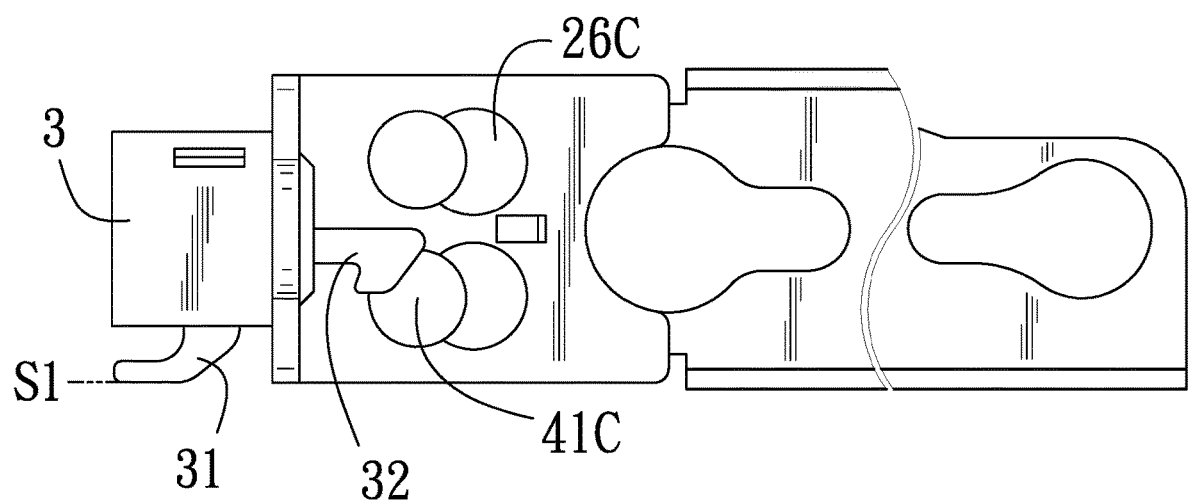
FIG. 6e is a schematic top view of the fourth embodiment of the invention being installed on the first slide rail.

As shown in FIG. 6e, the positioning hole 25C of the connecting member 2C of the tool-free unlocking mechanism 1 and the latching portions 41C of the first slide rail 4C are arranged and fixed. At this time, the mounting member 3 is not subjected to a force F on the actuating member 31, and the mechanism is still maintained in the positioning state S1.

Figure 7:
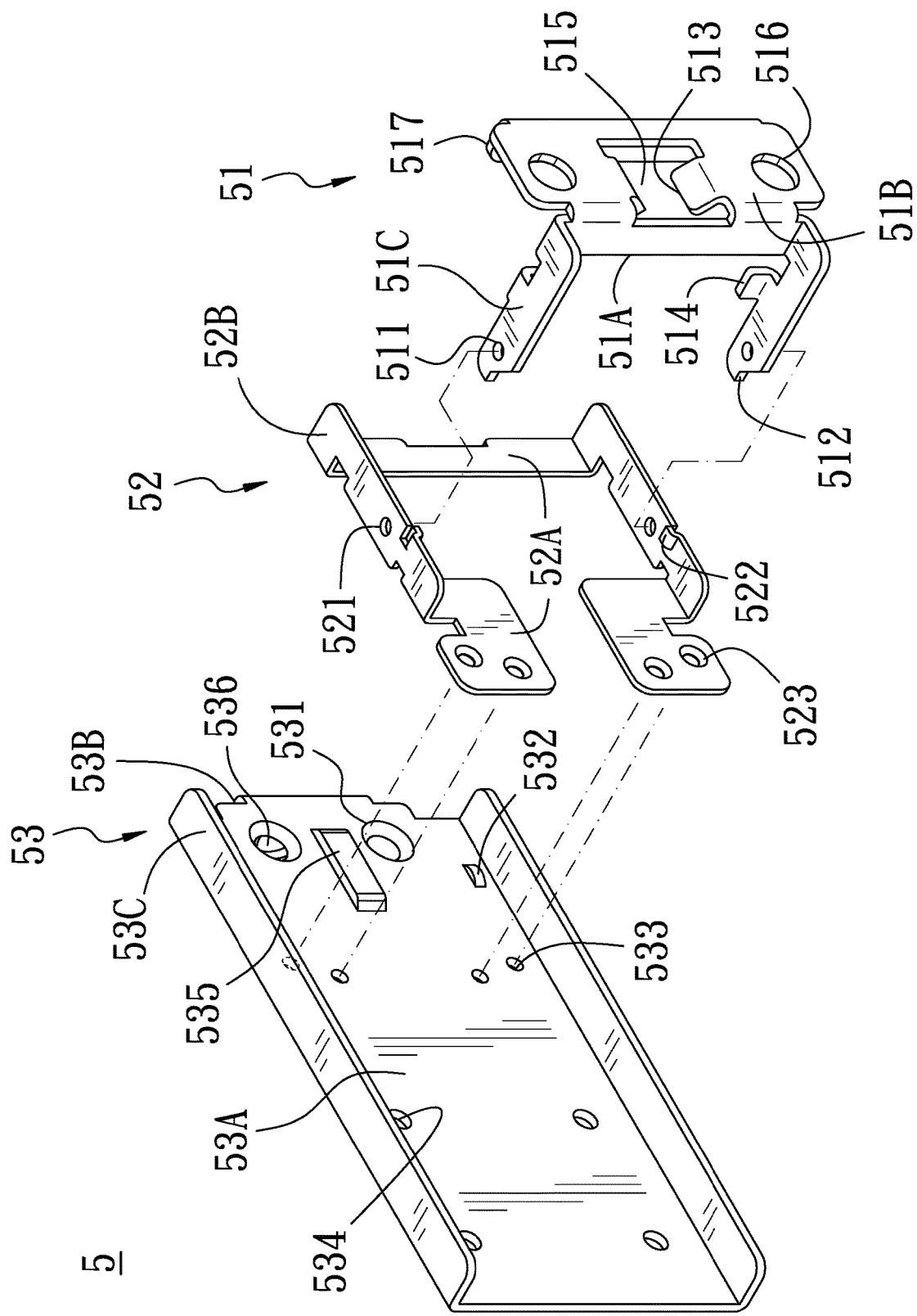
FIG. 7 is a schematic exploded view of a bracket of the present invention.
Figure 8A:
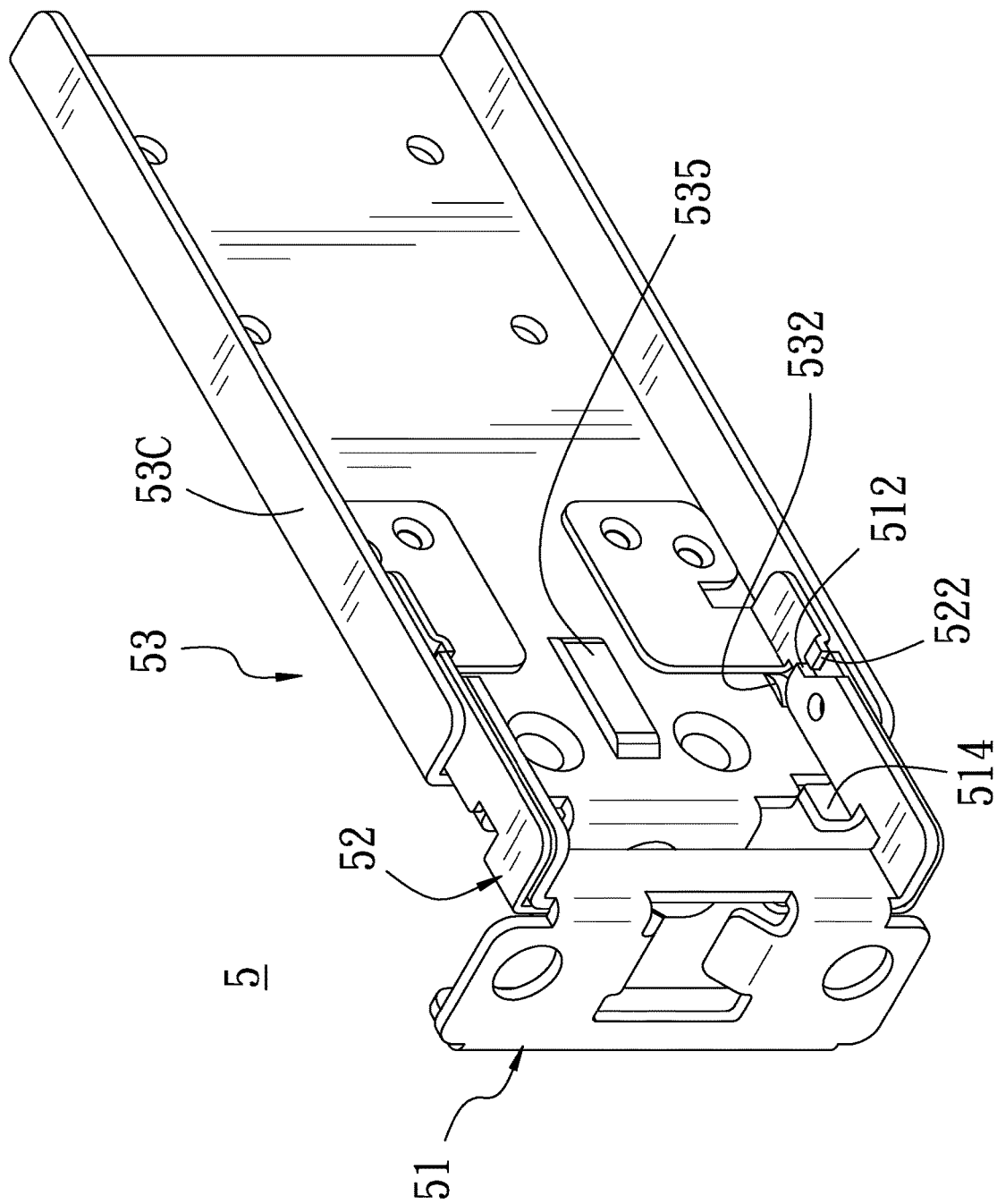
FIG. 8a is a three-dimensional view of the bracket of the present invention.
Figure 8B:
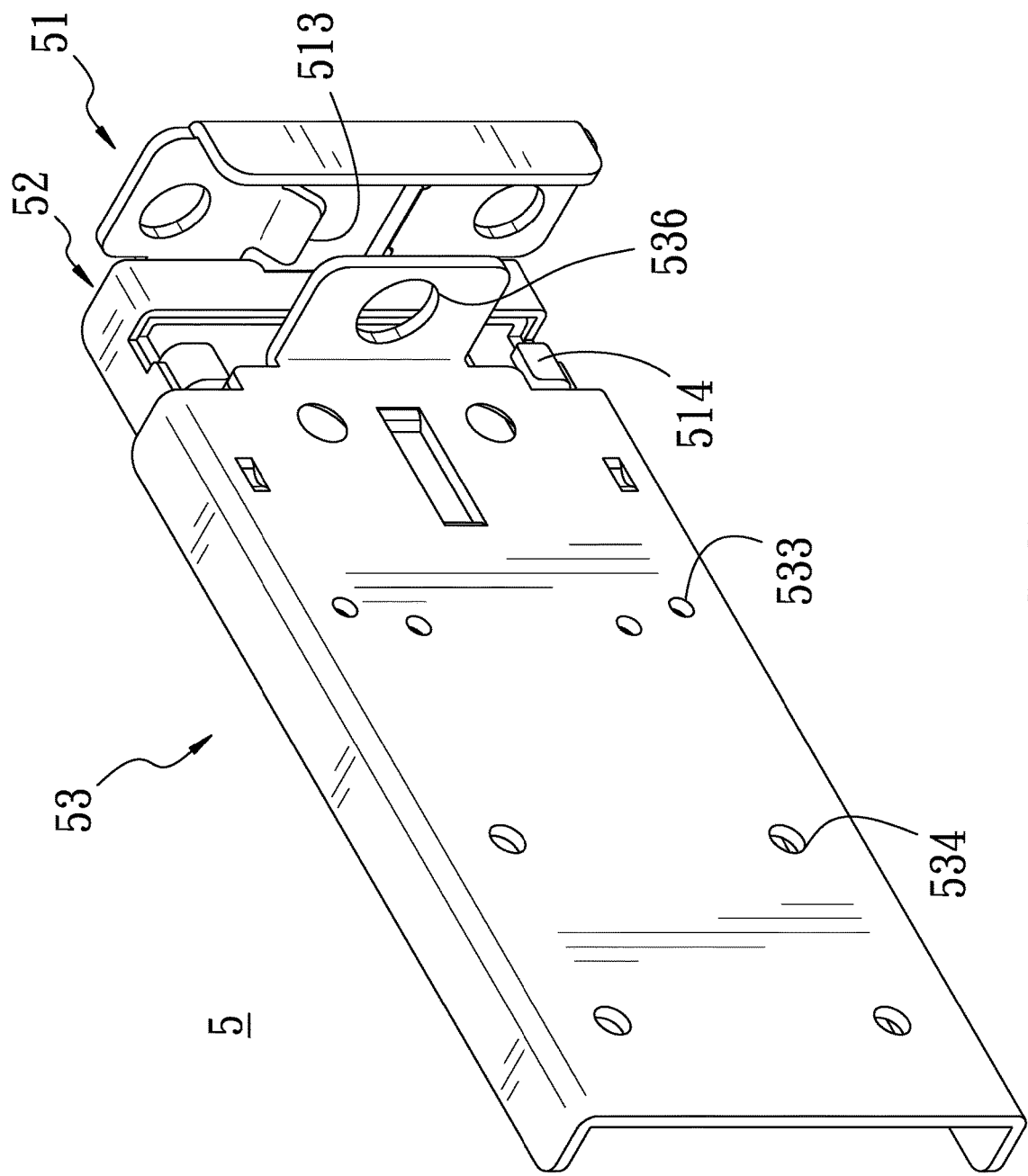
FIG. 8b is another three-dimensional view of the bracket of the present invention.

As shown in FIG. 7, it is a schematic exploded view of a bracket 5. The bracket 5 comprises a first buckle member 51, a second buckle member 52 and a connecting frame 53, and the second buckle member 52 is fixed on the connecting frame 53 and the second buckle member 52 is fixed on the first buckle member 51. The first buckle member 51 is bent to form a first bottom wall 51A, a first convex wall 51B and a first side wall 51C. The second buckle member 52 is bent to form a second bottom wall 52A and a second side wall 52B. The connecting frame 53 is bent to form a third bottom wall 53A, a second convex wall 53B and a third side wall 53C.

Preferably, the first buckle member 51 can be rotated or positioned on the second buckle member 52.

The first buckle member 51 comprises first holes 511, an abutting feature 512, a positioning feature 513, a second limiting feature 514, a buckle hole 515, fixing holes 516 and a first limiting feature 517. The second buckle member 52 comprises second holes 521, a stop feature 522 and third holes 523. The connecting frame 53 comprises a fifth holes 531, a guiding feature 532 that is arc-shaped, fourth holes 533, sixth holes 534, a supporting feature 535 that is a horizontal groove, and a seventh holes 536.

Preferably, the positioning feature 513 that is a bent wall extending inside the buckle hole 515, so that the snap feature 32 is to be snapped to the positioning feature 513. Both the buckle hole 515 and the fixing holes 516 are located at the first convex wall 51B.

Preferably, the second buckle member 52 and the connecting frame 53 are combined by the third holes 523 and the fourth holes 533.

Preferably, the abutting feature 512 that is one end of the first side wall 51C, and the stop feature 522 that is located at the second side wall 52B. The abutting feature 512 and the stop feature 522 keep abutting against each other, so that the mounting member 3 is in the positioning state S1.

Preferably, the first holes 511 that is located at the first side wall 51C, and the second holes 521 that is located at the second side wall 52B, and the guiding feature 532 that is located at the third bottom wall 53A, the first hole 511 and the second hole 521 can form a rotating shaft, so that the first buckle member 51 and the second buckle member 52 can be rotated relative to each other.

Preferably, the first buckle member 51 and the second buckle member 52 rotate, and the guiding feature 532 of the connecting frame 53 can guide the first buckle member 51 and the second buckle member 52 for pivotal separation.

Preferably, the first limiting feature 517 that is extend and bend at the first convex wall 51B and a second limiting feature 514 that is extend and bend at the first side wall 51C, the second limiting feature 514 is a side wall for limiting the horizontal displacement of the server slide rail when the server slide rail is mounted on the server column.

Preferably, the fifth holes 531 is located at the front of the third bottom wall 53A and the seventh holes 536 is located at the second convex wall 53B, and another fastener is fixed with the connecting frame 53 by the fifth holes 531 and the seventh holes 536.

As shown in FIGS. 8a, 8b, 11 and 12, the three-dimensional representation of the bracket 5, the bracket 5 comprises the first buckle member 51, the second buckle member 52, and the connecting frame 53, wherein the bracket 5 is arranged and fixed on the second slide rail 6 relative to the first slide rails 4, 4A, 4B, 4C, so that the snap feature 32 of the mounting member 3 of the tool-free unlocking mechanism 1 can act on the positioning feature 513 of the bracket 5.

Figure 9:
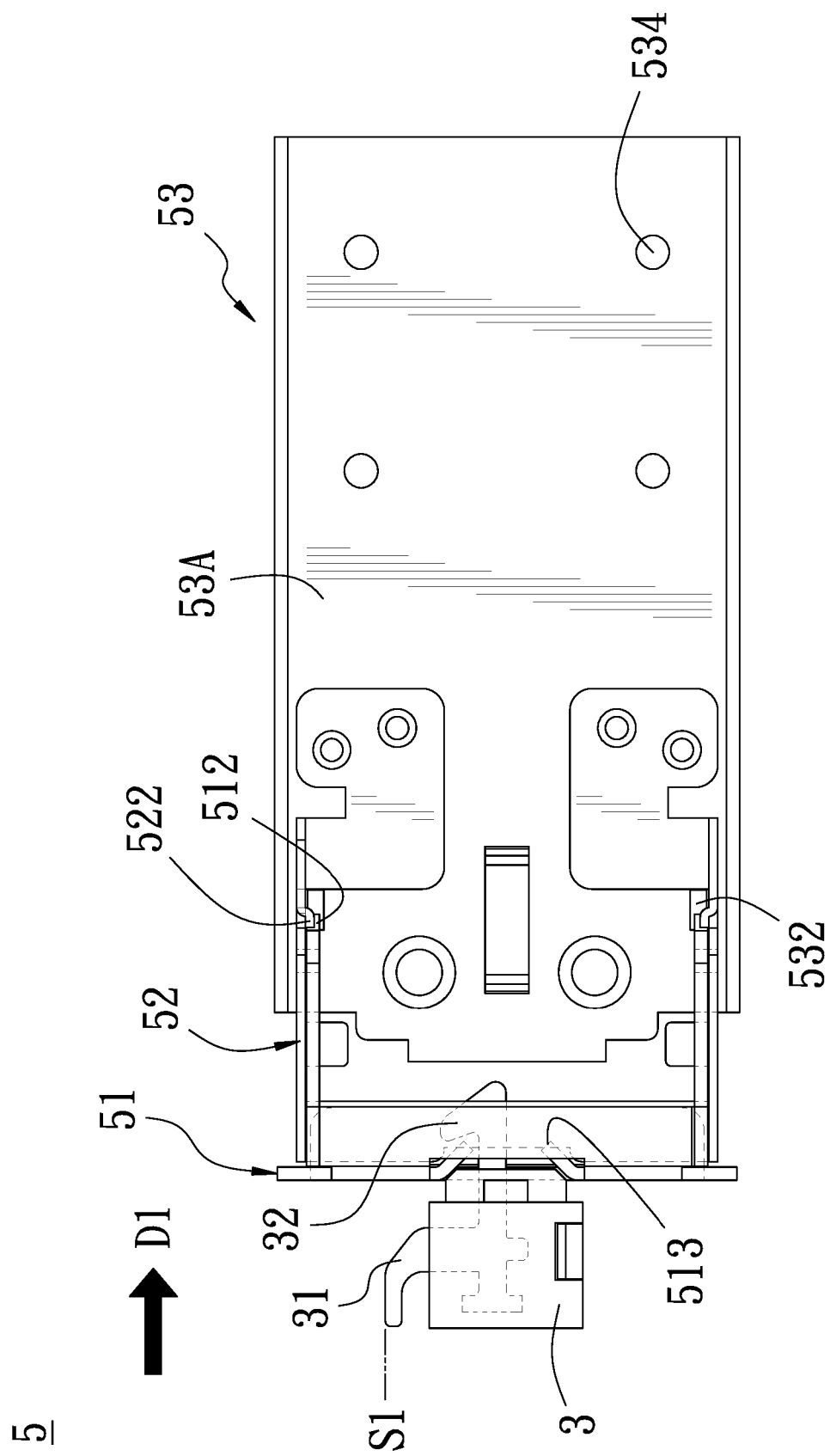
FIG. 9 is a schematic view of the tool-free unlocking mechanism and bracket action state I of the present invention.
Figure 10:
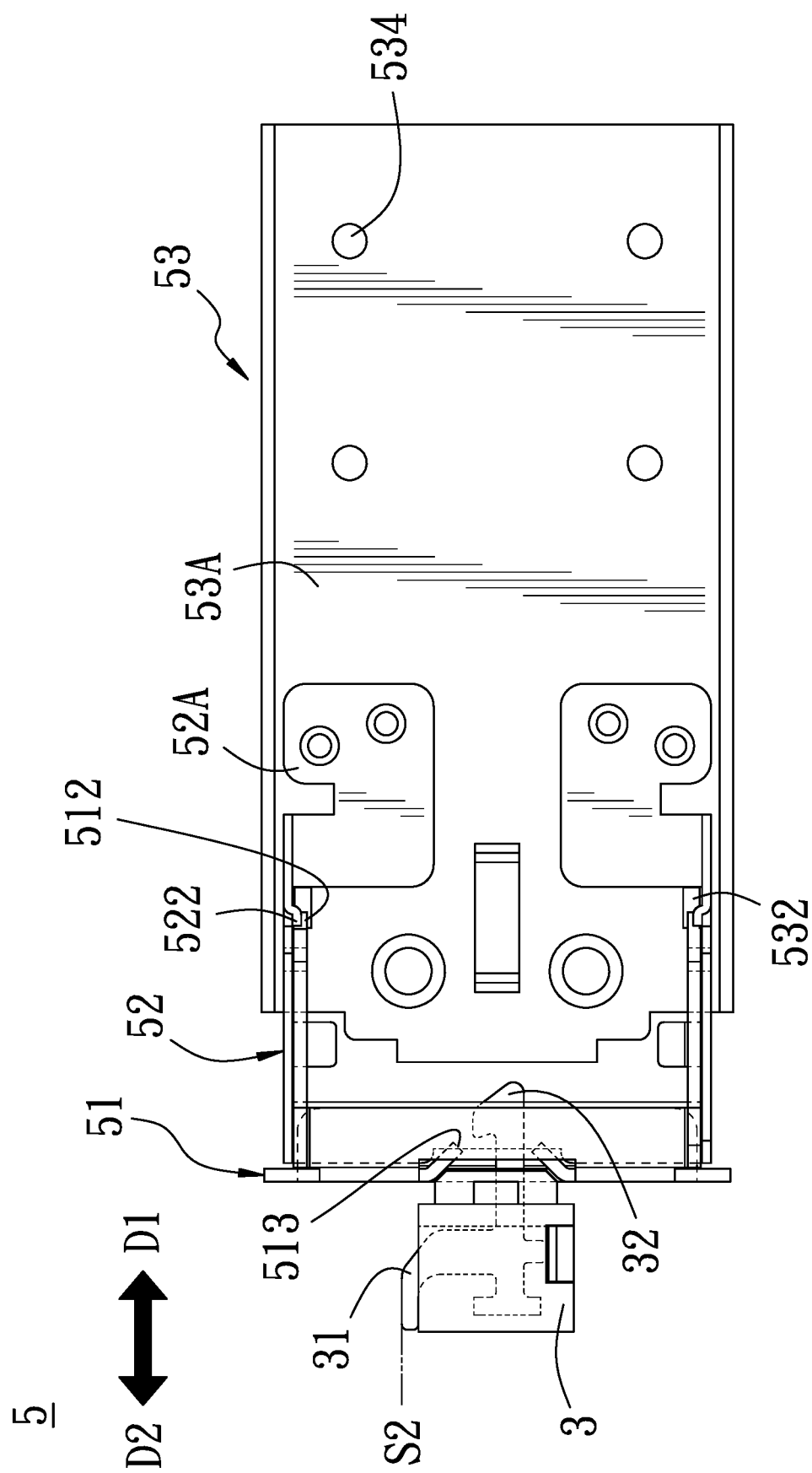
FIG. 10 is a schematic view of the tool-free unlocking mechanism and bracket action state II of the present invention.

As shown in FIGS. 9 and 10, in order to clearly illustrate the operating states of the tool-free unlocking mechanism 1 and the bracket 5, only the mounting member 3 and the bracket 5 are shown.

As shown in FIG. 9, when the mounting member 3 does not apply an external force F, the mounting member 3 is towarding the closing direction D1, and at this moment, the snap feature 32 of the mounting member 3 and the positioning feature 513 of the first buckle member 51 of the bracket 5 are mutually stuck, so that the tool-free unlocking mechanism 1 is in the positioning state S1, wherein the snap feature 32 is the bent end of the actuating element 31, and the positioning feature 513 is the bent wall of the first buckle member 51.

As shown in FIG. 10, when an external force F is applied to the actuating element 31 of the mounting member 3 of the mechanism, the snap feature 32 of the mounting member 3 begins to compress its elastic element 33 and the positioning feature 513 of the first buckle member 51 of the bracket 5 is separated from the snap feature 32. At this time, the mounting member 3 can travel in the opening direction D2, so that the tool-free unlocking mechanism 1 is in the unlocking state S2.

Figure 11:
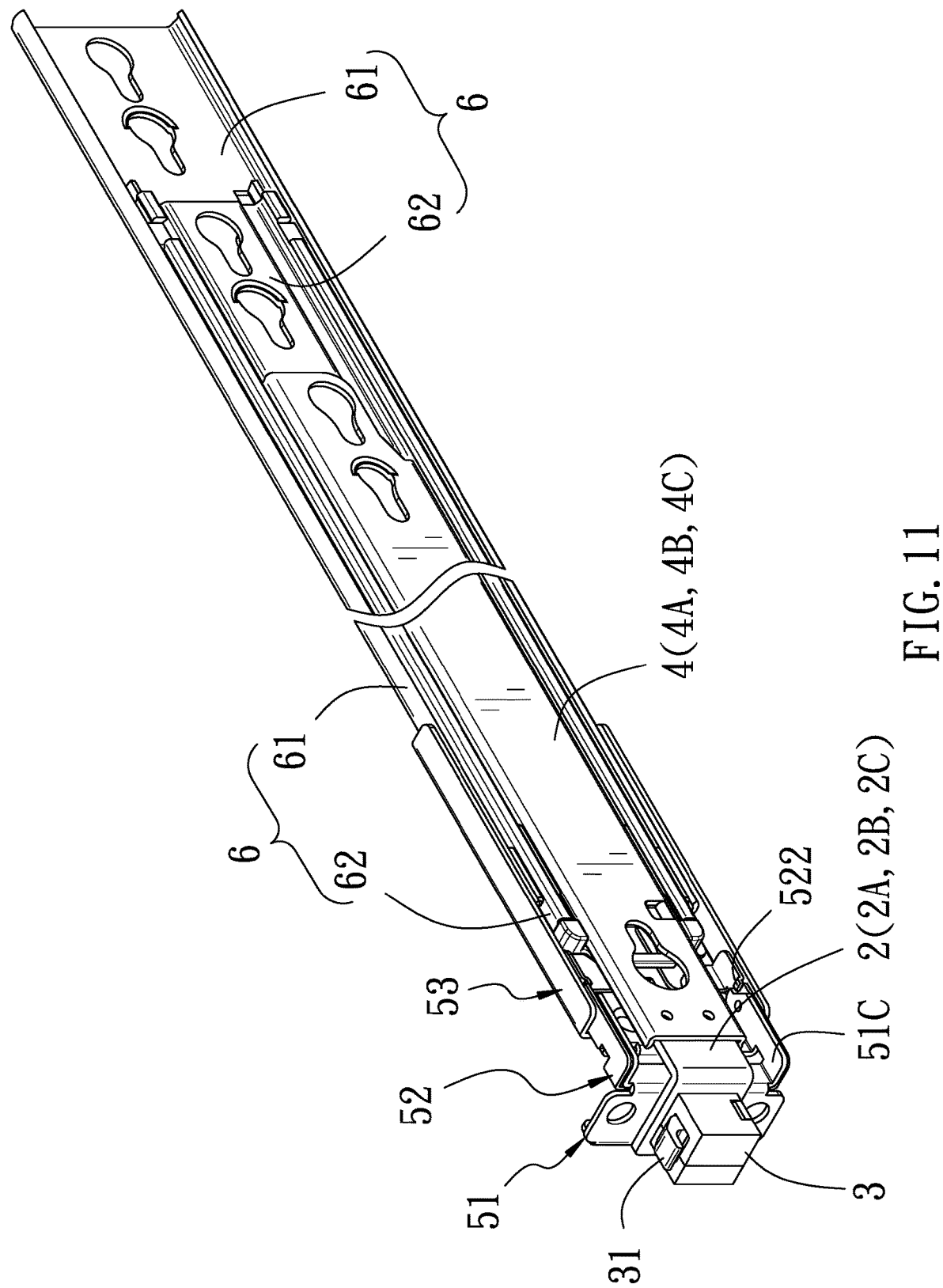
FIG. 11 is a three-dimensional view of the tool-free unlocking mechanism combined with the first and second slide rails.
Figure 12:
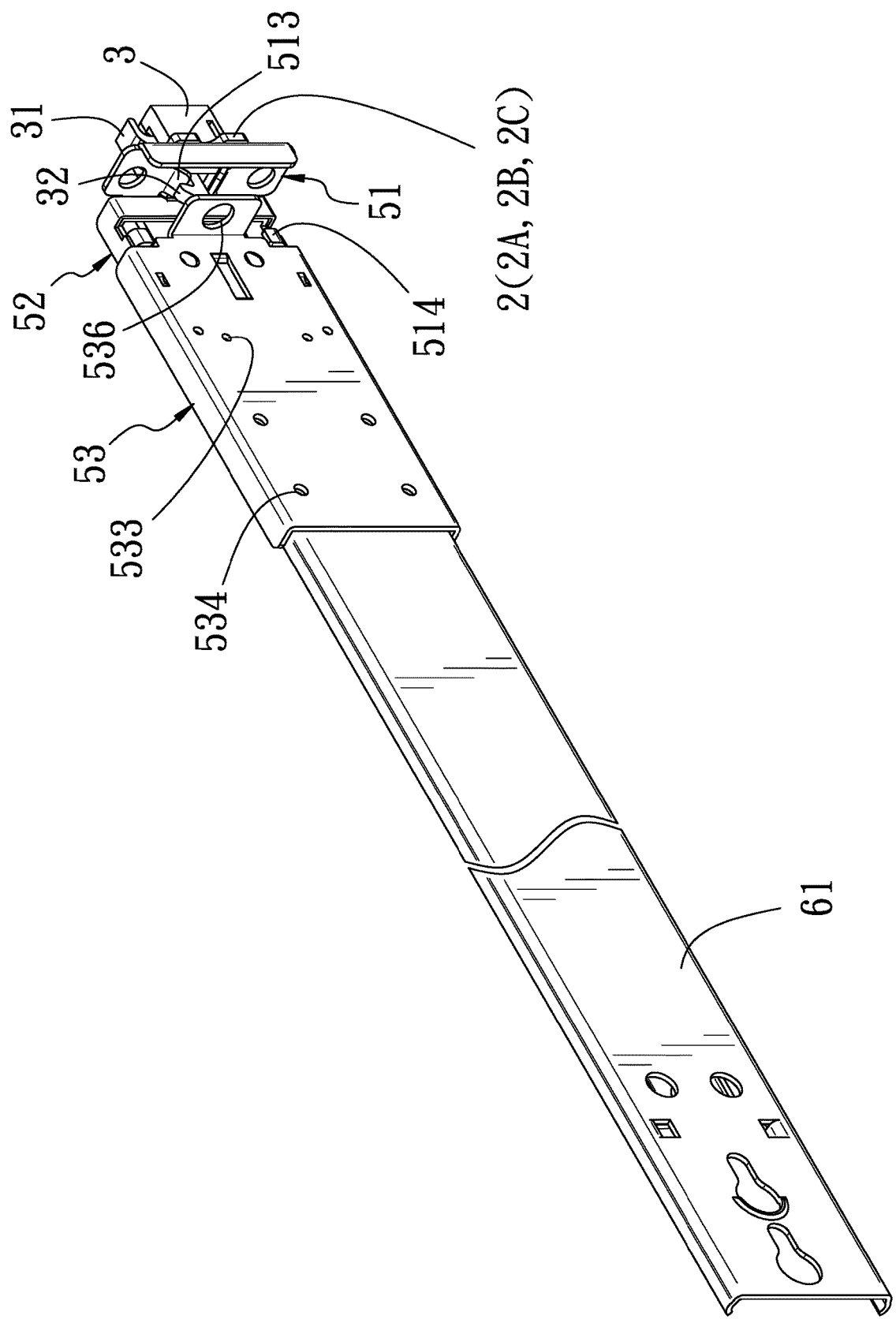
FIG. 12 is another three-dimensional view of the tool-free unlocking mechanism combined with the first and second slide rails.

As shown in FIGS. 11 and 12, the first slide rail 4, 4A, 4B, 4C is an inner frame and the second slide rail 6 comprises an outer frame 61 and a middle frame 62, the middle frame 62 is slidably sleeved in the outer frame 61 and the inner frame is slidably sleeved in the middle frame 62, and the outer frame 61 is combined to the connecting frame 53.

Preferably, the tool-free unlocking mechanism 1 is fixed on the first slide rail 4, 4A, 4B, 4C and the first slide rail 4, 4A, 4B, 4C is movable relative to the second slide rail 6, and the bracket 5 is fixed on the second slide rail 6, so that the tool-free unlocking mechanism 1 is displaced to a predetermined position to be mutually snapped with the first buckle member 51 of the bracket 5 to be fixed in the positioning state S1, and applying force to the actuating member 31 separates the tool-free unlocking mechanism 1 from the bracket 5 to the unlocking state S2.

Preferably, the sixth holes 534 is located at the rear of the third bottom wall 53A, and the outer frame 61 is combined to the connecting frame 53 by the sixth holes 534.

Preferably, the connecting frame 53 comprises a supporting feature 535 that is located at the third bottom wall 53A. When the middle frame 62 is sliding, the supporting feature 535 is used to support a part of the middle frame 62, so that prevent the middle frame 62 from colliding with a screw on the outer frame when sliding.

What is claimed is:

1. A tool-free unlocking mechanism comprising:
a mounting member, said mounting member comprising at least one elastic element and an actuating element, said actuating element comprises a snap feature, and said actuating element is supported by the elastic force of said at least one elastic element; and
a connecting member, said connecting member being used to connect said mounting member and a first slide rail, said connecting member comprising a positioning portion, a bending portion and a mounting portion, said positioning portion to be arranged and fixed on said first slide rail, said mounting portion being provided with at least one mounting hole to be arranged to fix said mounting member;
whereby the tool-free unlocking mechanism is fixed on said first slide rail, said first slide rail movable relative to a second slide rail, and a bracket is fixed on said second slide rail, so that the tool-free unlocking mechanism is displaced to a predetermined position to be mutually snapped with a first buckle member of said bracket to be fixed in a positioning state, and applying force to said actuating member separates the tool-free unlocking mechanism from said bracket to an unlocking state;
wherein said first buckle member comprising a buckle hole and a positioning feature, said positioning feature that is a bent wall extending inside said buckle hole, so that said snap feature to be snapped to said positioning feature.

2. The tool-free unlocking mechanism as claimed in claim 1, wherein said snap feature that is a bent end.

3. The tool-free unlocking mechanism as claimed in claim 1, wherein said connecting member being L-shaped by stamping.

4. The tool-free unlocking mechanism as claimed in claim 1, wherein said positioning portion comprises at least one positioning hole, said positioning hole being rectangular or round.

5. The tool-free unlocking mechanism as claimed in claim 1, wherein said positioning portion having at least a connecting feature, said connecting feature form a convex or an opening that is arranged and fastened to said first slide rail.

6. The tool-free unlocking mechanism as claimed in claim 1, wherein a width of said connecting member is smaller than a width of said first slide rail, so that said connecting member slides into a frame groove of said first slide rail to be fixed.

7. A tool-free unlocking mechanism comprising:
a mounting member, said mounting member comprising at least one elastic element and an actuating element, said actuating element comprises a snap feature, and said actuating element is supported by the elastic force of said at least one elastic element; and
a connecting member, said connecting member being used to connect said mounting member and a first slide rail, said connecting member comprising a positioning portion, a bending portion and a mounting portion, said positioning portion to be arranged and fixed on said first slide rail, said mounting portion being provided with at least one mounting hole to be arranged to fix said mounting member;

whereby the tool-free unlocking mechanism is fixed on said first slide rail, said first slide rail movable relative to a second slide rail, and a bracket is fixed on said second slide rail, so that the tool-free unlocking mechanism is displaced to a predetermined position to be mutually snapped with a first buckle member of said bracket to be fixed in a positioning state, and applying force to said actuating member separates the tool-free unlocking mechanism from said bracket to an unlocking state;

wherein said bracket comprises a second buckle member and a connecting frame, said second buckle member is fixed on said connecting frame and said second buckle member is fixed on said first buckle member.

8. The tool-free unlocking mechanism as claimed in claim 7, wherein said first buckle member comprising a buckle hole and a positioning feature, said positioning feature that is a bent wall extending inside said buckle hole, so that said snap feature to be snapped to said positioning feature.

9. The tool-free unlocking mechanism as claimed in claim 7, wherein said first buckle member is bent to form a first bottom wall, a first convex wall and a first side wall; said second buckle member is bent to form a second bottom wall and a second side wall; said connecting frame is bent to form a third bottom wall, a second convex wall and a third side wall.

10. The tool-free unlocking mechanism as claimed in claim 9, wherein said first buckle member comprises an abutting feature, said abutting feature that is one end of said first side wall, and said second buckle member comprises a stop feature that is located on said second side wall, said abutting feature and said stop feature keep abutting against each other.

11. The tool-free unlocking mechanism as claimed in claim 9, wherein said first buckle member comprises a first hole that is located on said first side wall, said second buckle member comprises a second hole that is located on said second side wall, and said connecting frame comprises a guiding feature that is located on said third bottom wall, said first hole and said second hole can form a rotating shaft, so that said first buckle member and said second buckle member can be rotated relative to each other, and said guiding feature can guide said first buckle member and said second buckle member for pivotal separation.

12. The tool-free unlocking mechanism as claimed in claim 9, wherein said first buckle member comprises a first limiting feature that is extend and bend on said first convex wall located and a second limiting feature that is extend and bend on said first side wall.

13. The tool-free unlocking mechanism as claimed in claim 9, wherein said first slide rail is an inner frame and said second slide rail comprises an outer frame and a middle frame, said middle frame is slidably sleeved in said outer frame and said inner frame is slidably sleeved in the middle frame, and said outer frame is combined to said connecting frame.

14. The tool-free unlocking mechanism as claimed in claim 13, wherein said connecting frame comprises a supporting feature that is located on said third bottom wall, and when said middle frame is sliding, said supporting feature is used to support a part of said middle frame.

15. The tool-free unlocking mechanism as claimed in claim 7, wherein said snap feature that is a bent end.

16. The tool-free unlocking mechanism as claimed in claim 7, wherein said connecting member being L-shaped by stamping.

17. The tool-free unlocking mechanism as claimed in claim 7, wherein said positioning portion comprises at least one positioning hole, said positioning hole being rectangular or round.

18. The tool-free unlocking mechanism as claimed in claim 7, wherein said positioning portion having at least a connecting feature, said connecting feature form a convex or an opening that is arranged and fastened to said first slide rail.

19. The tool-free unlocking mechanism as claimed in claim 7, wherein a width of said connecting member is smaller than a width of said first slide rail, so that said connecting member slides into a frame groove of said first slide rail to be fixed.

* * * * *